United States Patent [19]
Leddige et al.

[11] Patent Number: 6,144,576
[45] Date of Patent: *Nov. 7, 2000

[54] METHOD AND APPARATUS FOR IMPLEMENTING A SERIAL MEMORY ARCHITECTURE

[75] Inventors: Michael W. Leddige, Beaverton; Bryce D. Horine, Aloha, both of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/136,797

[22] Filed: Aug. 19, 1998

[51] Int. Cl.⁷ ...................................................... G11C 5/06
[52] U.S. Cl. .................................................. 365/63; 365/51
[58] Field of Search .................................. 365/63, 51, 52, 365/72, 230.03

[56] References Cited

U.S. PATENT DOCUMENTS

| | | | |
|---|---|---|---|
| 4,740,916 | 4/1988 | Martin | 711/115 |
| 5,313,416 | 5/1994 | Kimura | 365/52 |
| 5,357,621 | 10/1994 | Cox | 395/400 |
| 5,404,460 | 4/1995 | Thomsen et al. | 395/275 |
| 5,430,859 | 7/1995 | Norman et al. | 395/425 |
| 5,495,435 | 2/1996 | Sugahara | 365/52 |
| 5,651,129 | 7/1997 | Yokote et al. | 395/431 |
| 5,680,364 | 10/1997 | Lee | 365/230.03 |
| 5,768,173 | 6/1998 | Seo et al. | 365/52 |
| 5,860,142 | 1/1999 | Cepulis | 711/202 |

*Primary Examiner*—David Nelms
*Assistant Examiner*—Gene N. Auduong
*Attorney, Agent, or Firm*—Blakely, Sokoloff, Taylor & Zafman LLP

[57] ABSTRACT

A serial memory architecture. A memory subsystem includes a bus and a first memory module coupled to the bus. The first memory module has a first connector to receive bus signals from the bus and a second connector to output the bus signals. A second memory module has a first connector to receive the bus signals from the second connector of the first memory module. The bus signals are thereby routed through the memory modules in a serial manner. In one embodiment the memory modules include one or more 90° routing paths between connectors and the devices of the memory modules. In one embodiment, trace lengths are matched.

19 Claims, 9 Drawing Sheets

METHOD AND APPARATUS FOR IMPLEMENTING A SERIAL MEMORY ARCHITECTURE

FIELD OF THE INVENTION

The present invention relates to memory systems in computer systems. More specifically, the present invention relates to a method and apparatus for implementing an improved multi-module memory system.

BACKGROUND OF THE INVENTION

The role of a memory system is twofold. It provides reliable and consistent data storage and quick responses to read and write requests of processors and input/output (I/O) devices. Most memory systems include a plurality of memory devices such as dynamic random access memories (DRAMs), synchronous direct random access memories (SDRAMs), or other memory devices.

The Dual In-Line Memory Module (DIMM) has become an industry standard memory packaging design. DIMMs are small printed circuit boards mounted with a plurality of memory devices. DIMMs have 168 pins and can transfer 64 bits at a time. DIMMs have leads accessible via both sides of a printed circuit board's electrical connector unlike its predecessor, the Single In-Line Memory Module (SIMM), which has leads on only one side of the printed circuit board's electrical connector. DIMMs are inserted into small socket connectors that are soldered onto a larger printed circuit board, or motherboard. Because DIMMs are socketed, they are inherently replaceable and upgradeable.

Typically, a memory system in a computer system includes a plurality of DIMMs. The DIMMs are coupled in parallel to a memory bus having address, data, and control lines. The memory bus is routed onto each DIMM and to each of the plurality of memory devices mounted on each of the DIMM. The memory devices are connected in parallel via the memory bus.

SUMMARY

A memory system is disclosed. The memory system includes a first memory module. A second memory module is connected in series with the first memory module.

BRIEF DESCRIPTION OF THE DRAWINGS

The present invention is illustrated by way of example and not by way of limitation in the figures of the accompanying drawings, in which the like references indicate similar elements in and in which.

DETAILED DESCRIPTION

Figure 1:
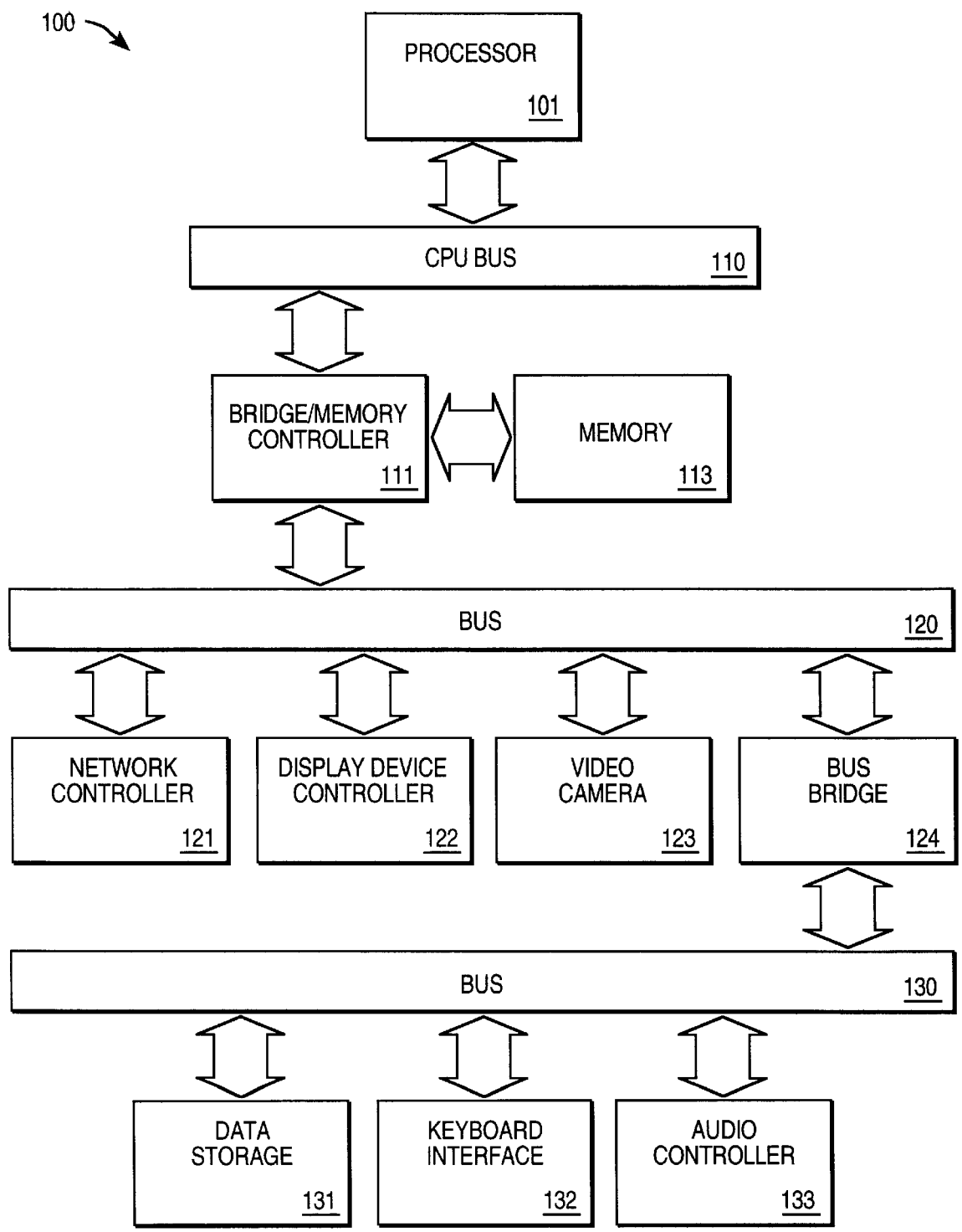
FIG. 1 is a block diagram of a computer system implementing an embodiment of the present invention.

FIG. 1 illustrates a computer system 100 upon which an embodiment of the present invention can be implemented. The computer system 100 includes a processor 101 that processes data signals. The processor 101 may be a complex instruction set computer (CISC) microprocessor, a reduced instruction set computing (RISC) microprocessor, a very long instruction word (VLIW) microprocessor, a processor implementing a combination of instruction sets, or other processor device. FIG. 1 shows an example of the present invention implemented on a single processor computer system 100. However, it is understood that the present invention may be implemented in a computer system having multiple processors. The processor 101 is coupled to a CPU bus 110 that transmits data signals between processor 101 and other components in the computer system 100.

The computer system 100 includes a memory 113. The memory 113 may be a dynamic random access memory (DRAM) device, a synchronous direct random access memory (SDRAM) device, or other memory device. The memory 113 may store instructions and code represented by data signals that may be executed by the processor 101. According to an embodiment of the computer system 100, the memory 113 comprises a memory system having a plurality of memory modules. Each of the memory modules comprises a printed circuit board having a plurality of memory devices mounted on the printed circuit board. The printed circuit board operates as a daughter card insertable into a socket connector that is connected to the computer system 100.

A bridge memory controller 111 is coupled to the CPU bus 110 and the memory 113. The bridge memory controller 111 directs data signals between the processor 101, the memory 113, and other components in the computer system 100 and bridges the data signals between the CPU bus 110, the memory 113, and a first I/O bus 120.

The first I/O bus 120 may be a single bus or a combination of multiple buses. As an example, the first I/O bus 120 may comprise a Peripheral Component Interconnect (PCI) bus, a Personal Computer Memory Card International Association (PCMCIA) bus, a NuBus, or other buses. The first I/O bus 120 provides communication links between components in the computer system 100. A network controller 121 is coupled to the first I/O bus 120. The network controller 121 links the computer system 100 to a network of computers (not shown in FIG. 1) and supports communication among the machines. A display device controller 122 is coupled to the first I/O bus 120. The display device controller 122 allows coupling of a display device (not shown) to the computer system 100 and acts as an interface between the display device and the computer system 100. The display device controller 122 may be a monochrome display adapter (MDA) card, a color graphics adapter (CGA) card, an enhanced graphics adapter (EGA) card, an extended graphics array (XGA) card or other display device controller. The display device may be a television set, a computer monitor, a flat panel display or other display device. The display device receives data signals from the processor 101 through the display device controller 122 and displays the information and data signals to the user of the computer system 100. A video camera 123 is coupled to the first I/O bus 120.

A second I/O bus 130 may be a single bus or a combination of multiple buses. As an example, the second I/O bus 130 may comprise a PCI bus, a PCMCIA bus, a NuBus, an Industry Standard Architecture (ISA) bus, or other buses. The second I/O bus 130 provides communication links between components in the computer system 100. A data storage device 131 is coupled to the second I/O bus 130. The data storage device 131 may be a hard disk drive, a floppy disk drive, a CD-ROM device, a flash memory device or other mass storage device. A keyboard interface 132 is coupled to the second I/O bus 130. The keyboard interface 132 may be a keyboard controller or other keyboard interface. The keyboard interface 132 may be a dedicated device or can reside in another device such as a bus controller or other controller. The keyboard interface 132 allows coupling of a keyboard (not shown) to the computer system 100 and transmits data signals from a keyboard to the computer system 100. An audio controller 133 is coupled to the second I/O bus 130. The audio controller 133 operates to coordinate the recording and playing of sounds is also coupled to the I/O bus 130.

A bus bridge 124 couples the first I/O bus 120 to the second I/O bus 130. The bus bridge 124 operates to buffer and bridge data signals between the first I/O bus 120 and the second I/O bus 130.

Figure 2:
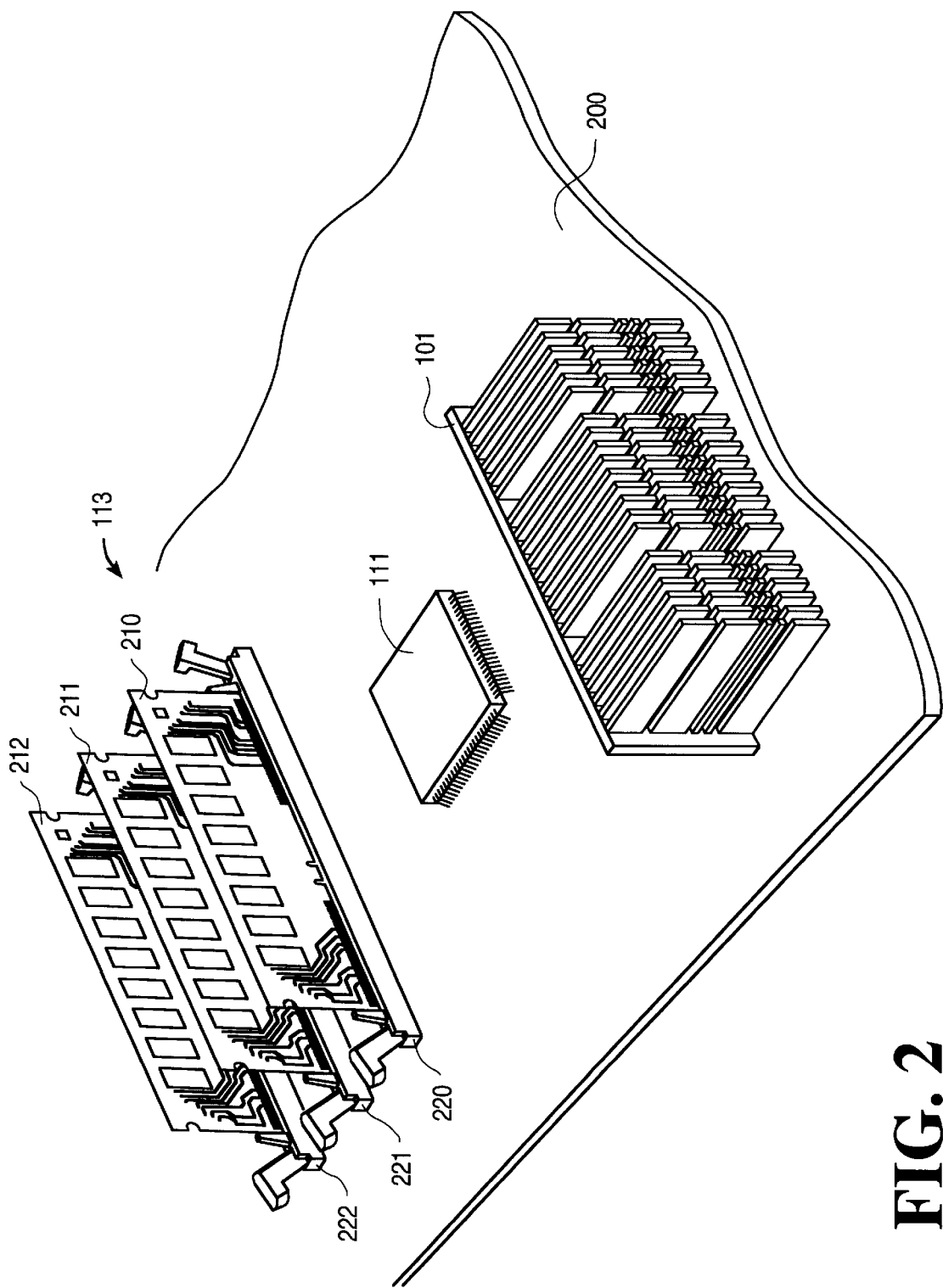
FIG. 2 illustrates a memory system mounted on a motherboard according to an embodiment of the present invention.

FIG. 2 illustrates a memory system 113 according to an embodiment of the present invention. The memory system 113 resides on a motherboard 200 of the computer system 100 (shown in FIG. 1). The motherboard 200 is a printed circuit board that interconnects components of the computer system 100 such as the bridge memory controller 111, the processor 101 and other components. The memory system 113 includes a plurality of memory modules 210–212. Each of the memory modules includes a plurality of memory devices mounted on the memory module. The memory system also includes a plurality of socket connectors 220–222 mounted on the motherboard 200. The memory modules 210–212 are insertable into the socket connectors 220–222. Electrical connectors on the memory module interface with electrical contacts in the socket connector. The electrical connectors and the electrical contacts allow components on the motherboard 200 to access the memory devices on the memory module. It should be appreciated that any number of socket connectors may be mounted on the motherboard to receive any number of memory modules. It should also be appreciated that any number of memory devices may be mounted on each memory module.

Figure 3:
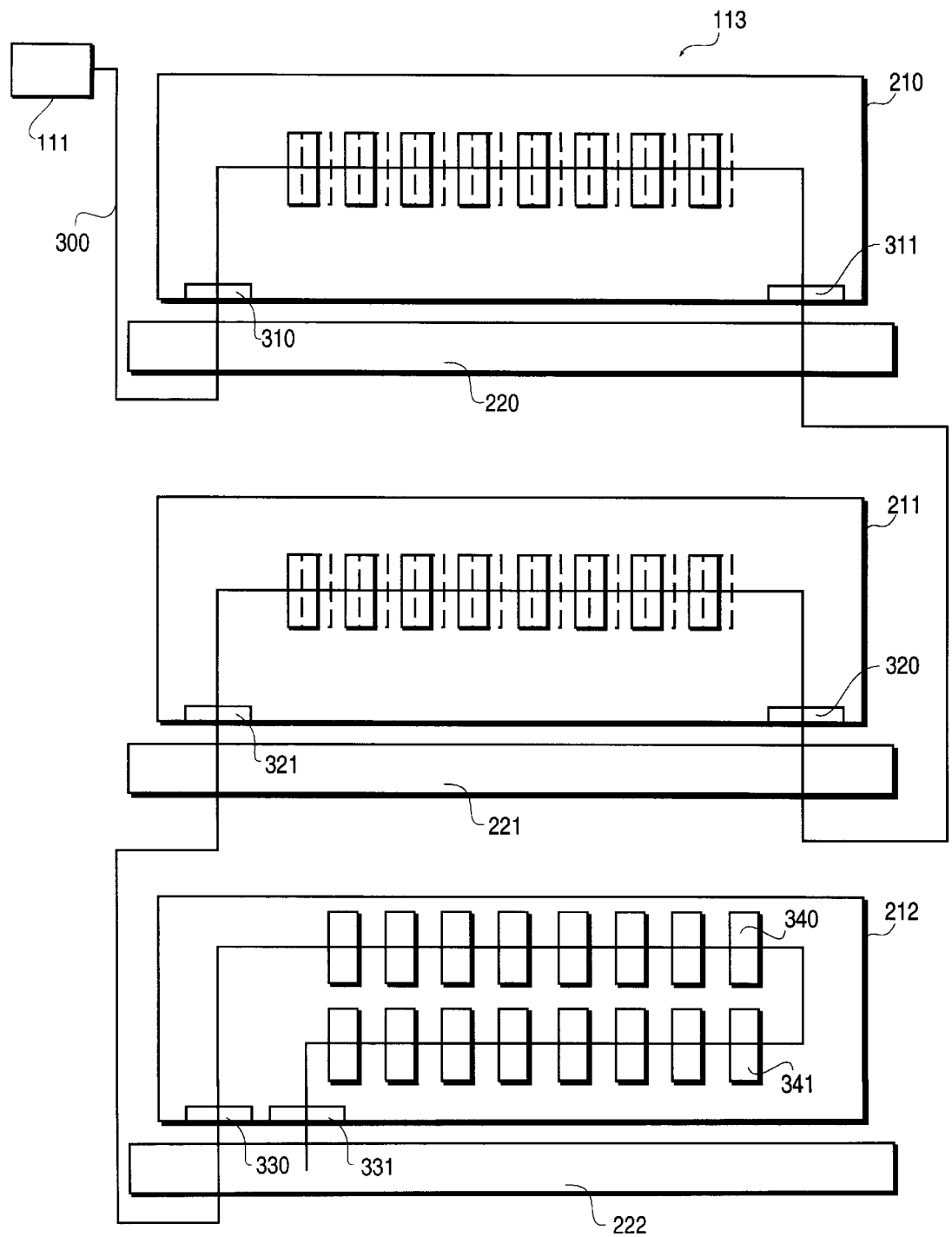
FIG. 3 illustrates a bus routing and wiring topology for a memory system according to an embodiment of the present invention.

FIG. 3 illustrates a bus routing and wiring topology for the memory system 113 according to an embodiment of the present invention. A memory bus 300 couples the bridge memory controller 111 to the memory system 113 and connects components in the memory system 113 together. The memory bus 300 is a serial bus that is serially routed from the bridge memory controller 111 to the socket connectors 220–222. The memory bus 300 is routed from the first socket connector 220 to a first edge connector 310 on the first memory module 210. The memory bus 300 is routed from the first edge connector 310 to each of the memory devices on the first memory module 210 serially connecting each of the of memory devices on the first memory module 210. The memory bus 300 is routed from the last of the serially connected memory devices on the first memory module 210 to a second edge connector 311 on the memory module 210. From the second edge connector 311, the memory bus 300 is routed back to the first socket connector 220 and onto the second socket connector 221.

Similarly, the memory bus 300 is routed from the second socket connector 221 onto a first edge connector 320 on the second memory module 211 and through a plurality of memory devices on the second memory module 211. The memory bus 300 serially connects each of the memory devices on the second memory module 211. The memory bus 300 is routed from the last of the serially connected memory devices on the second memory module 211 to a second edge connector 321 on the second memory module 211. The memory bus 300 is routed off the second edge connector 321 back to the second socket connector 221 and onto the third socket connector 222.

Similarly, the memory bus 300 is routed from the third socket connector 222 onto a first edge connector 330 on the third memory module 212 and through a plurality of memory devices on the third memory module 212. The memory bus 300 serially connects the plurality of memory devices on the third memory module 212 and is routed from the last memory device of the plurality of memory devices onto a second edge connector 331 on the third memory module 212. The memory bus is routed off the second edge connector 331 back onto the socket connector 222 where the bus is terminated.

Figure 4:
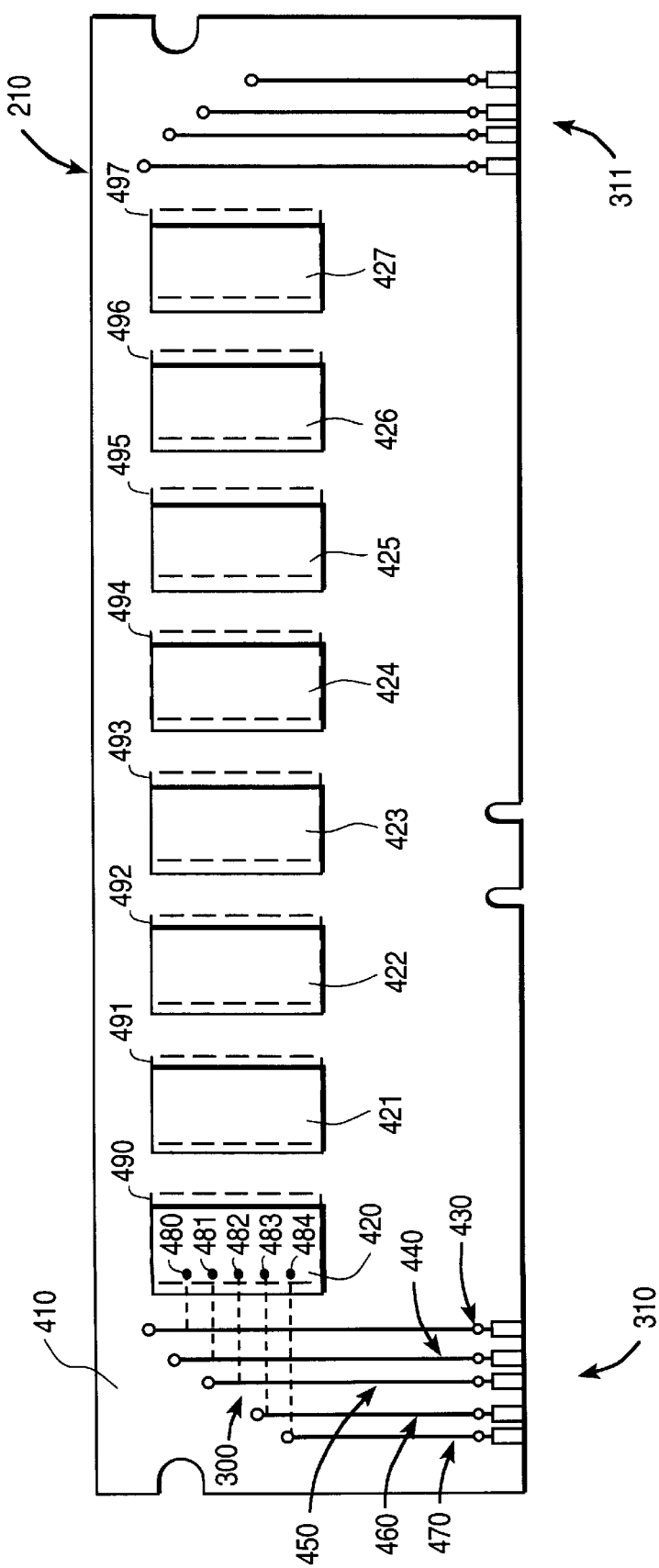
FIG. 4 illustrates an exemplary memory module according to an embodiment of the present invention.

FIG. 4 illustrates an exemplary embodiment of the first memory module 210 according to an embodiment of the present invention. The first memory module 210 includes a plurality of memory devices. Memory devices 420–427 are mounted on a first side 410 of the first memory module 210. Memory devices 490–497 are mounted on a second side (not shown) of the first memory module 210. The memory device 420 includes a plurality of contacts (not shown) that interface with land pads 480–484 on the first memory module 210. Memory devices 421–427 and 490–497 also include a plurality of contacts that interface with land pads on the memory module 210 but are not shown in FIG. 4. According to an embodiment of the present invention, the memory devices 420–427 and 490–497 are SDRAM devices. It should be appreciated that any type of memory devices may be mounted on the memory module 210. The memory devices 420–427 and 490–497 may be packaged in a ball grid array (BGA), chip scale package (CSP), or other type of packaging.

The memory module 210 includes a first electrical connector 310 that operates to transmit signals between the first socket connector 220 (shown in FIG. 3) and the memory device 420. The memory module 210 includes a second electrical connector 311 that operates to transmit signals from the memory device 497 and the first socket connector 220. According to an embodiment of the present invention, the first and second electrical connector 310 and 311 transmit address, data, control, and clock signals.

The memory bus 300 includes a plurality of signal lines 430, 440, 450, 460, and 470 that are coupled to the first electrical connector 310. The signal lines 430, 440, 450, 460, and 470 operate to transmit signals between the electrical connector 310 and the land pads 480–484 on the memory device 420. The signal lines 430, 440, 450, 460, and 470 make a 90° turn from the electrical connector 410 to the land pads 480–484. The signal lines 430, 440, 450, 460, and 470 are routed through two layers of the printed circuit board of the memory module 310. The signal lines 430, 440, 450, 460, and 470 are equal in length. The length of a signal line determines the electrical delay and capacitance on the signal line. Differences in electrical delay and capacitance between signal lines may adversely effect the performance of devices connected to the signal lines that operate at high speeds.

Figure 5:
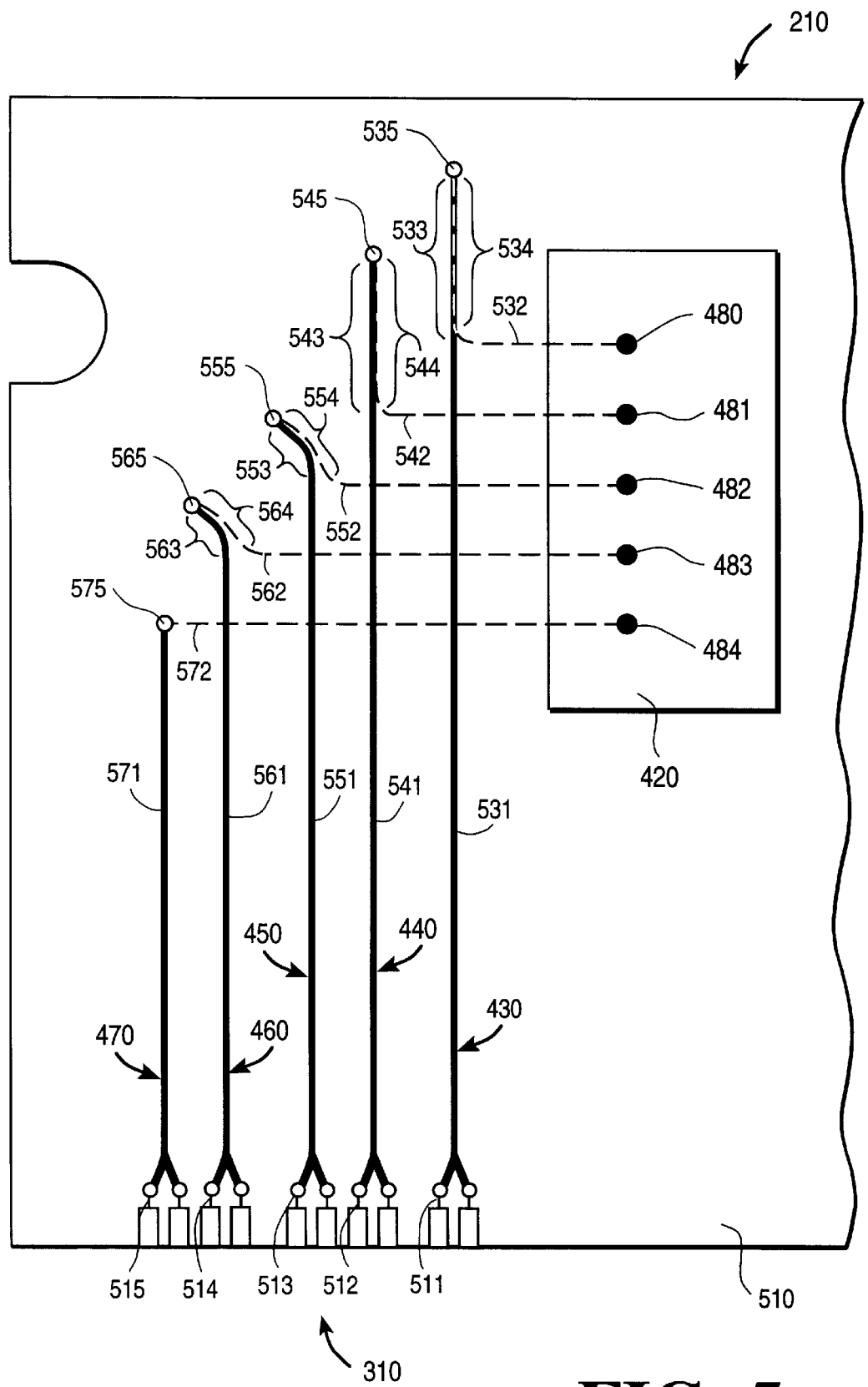
FIG. 5 illustrates an exemplary technique for routing signal lines making a 90° turn on a printed circuit board utilizing two layers of the printed circuit board according to an embodiment of the present invention.

FIG. 5 illustrates an exemplary technique for routing signal lines making 90° turns on a printed circuit board utilizing two layers of the printed circuit board according to an embodiment of the present invention. The signal line 430 includes a first trace 531 on a first layer 510 of the first memory module 210 that connects a first location 511 on the electrical connector 310 to a first via 535 on the first layer 510 of the first memory module 210. The signal line 430 includes a second trace 532 on a second layer (not shown) of the first memory module 210 that connects the first via 535 to the land pad 480. The signal line 440 includes a first trace 541 on the first layer 510 of the first memory module 210 that connects a second location 512 on the electrical connector 310 to a second via 545 on the first layer 510 of the first memory module 210. The signal line 440 includes a second trace 542 on the second layer of the first memory module 210 that connects the second via 545 to the land pad 481. The signal line 450 includes a first trace 551 on the first layer 510 of the first memory module 210 that connects a third location 513 on the electrical connector 410 to a third via 555 on the first layer 510 of the first memory module 210. The signal line 450 includes a second trace 552 on the second layer of the first memory module 210 that connects the third via 555 to the land pad 482. The signal line 460 includes a first trace 561 on the first layer 510 of the first memory module 210 that connects a fourth location 514 on the electrical connector 410 to a fourth via 565 on the first layer 510 of the first memory module 210. The signal line 460 includes a second trace 562 on the second layer of the first memory module 210 that connects the fourth via 565 to the land pad 483. The signal line 470 includes a first trace 571 on the first layer 510 of the first memory module 210 that connects a fifth location 515 on the electrical connector 410 to a fifth via 575 on the first layer 510 of the first memory module 210. The signal line 470 includes a second trace 572 on the second layer of the first memory module 210 that connects the fifth via 575 to the land pad 484.

The signal lines 430, 440, 450, 460, and 470 are routed such that they are equal in length. This is achieved by selecting a signal line length and strategically placing the vias 535, 545, 555, 565, and 575 at a location on the first memory module 210 such that signal lines routing through the vias 535, 545, 555, 565, and 575 would equal that signal line length. According to an embodiment of the present invention, some of the vias are placed at locations on the first memory module 210 which would require a section of a second trace on a second layer to double back towards a direction previously traveled by a section of a first trace on a first layer. Thus, when a signal line connecting a land pad and a location on the electrical connector 310 is shorter in length than the selected signal line length, a via corresponding to the signal line may be strategically moved to lengthen the traces on the signal line so that the length of the signal line matches the selected signal line length.

According to an embodiment of the present invention, when a section of a second trace doubles back towards a direction previously traveled by a section of a first trace, the section of the second trace may or may not directly retrace a path taken by a section of the first trace. Signal line 430 includes a first trace 531 having a first section 533 that is doubled back by a second section 534 of a second trace 532. A portion of the second section 534 retraces a path taken by a portion of the first section 533. Signal line 440 includes a first trace 541 having a first section 543 that is doubled back by a second section 544 of a second trace 542. A portion of the second section 544 also retraces a path taken by a portion of the first section 543. Signal line 450 includes a first trace 551 having a first section 553 that is doubled back by a second section 554 of a second trace 552. The second section 554 does not retrace a path taken by the first section 553. Signal line 460 includes a first trace 561 having a first section 563 that is doubled back by a second section 564 of a second trace 562. The second section 564 does not retrace a path taken by the first section 563.

Figure 6:
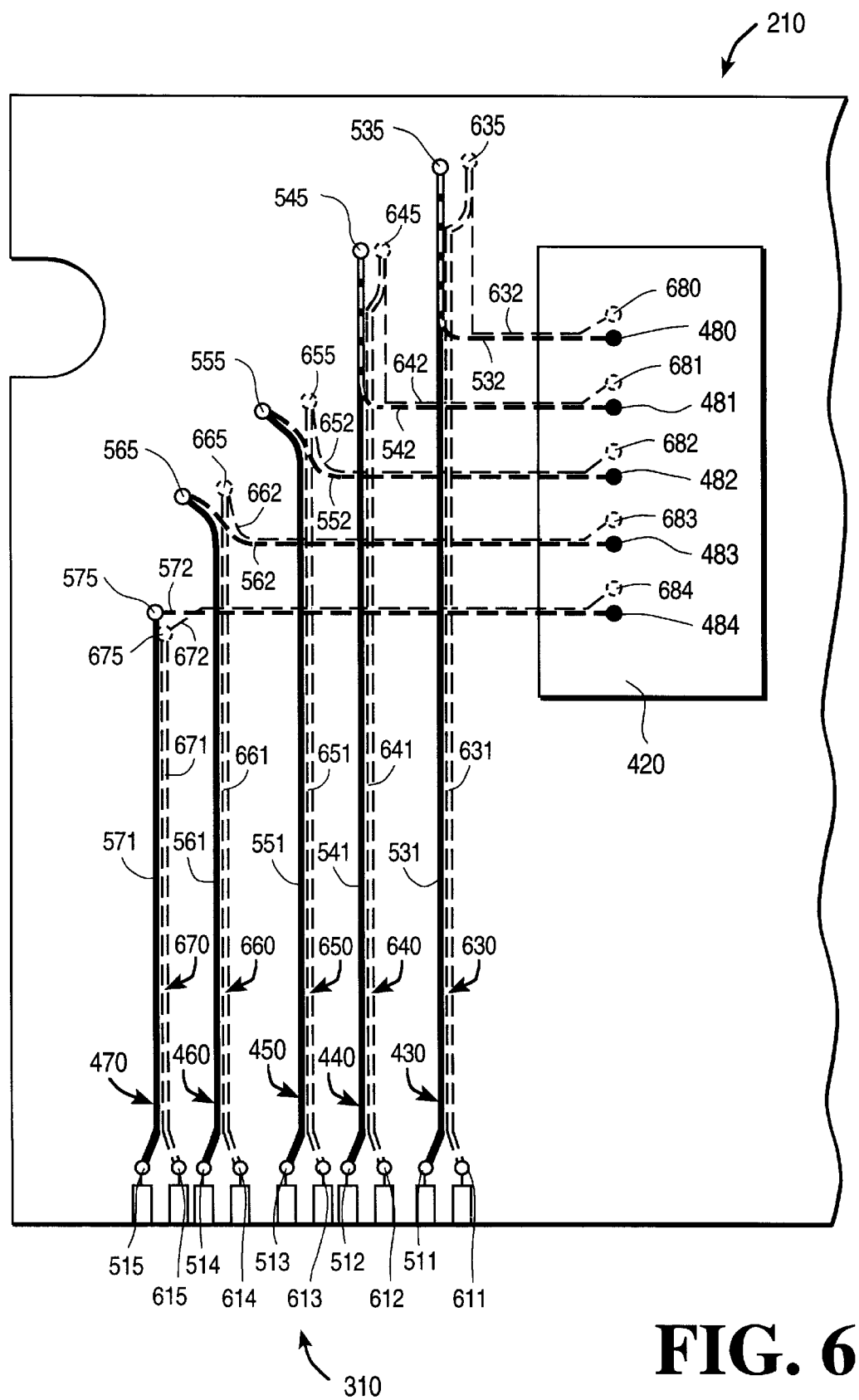
FIG. 6 illustrates an exemplary technique for routing signal lines making a 90° turn on a printed circuit board utilizing four layers of the printed circuit board according to an embodiment of the present invention.

FIG. 6 illustrates an exemplary technique for routing signal lines making 90° turns on a printed circuit board utilizing four layers of a printed circuit board according to an alternate embodiment of the present invention. FIG. 6 illustrates an embodiment of the first memory module 210 where the memory device 420 mounted includes a plurality of contacts (not shown) that interface with land pads 480–484 on the first memory module 210. The memory device 420 includes an additional plurality of contacts (not shown) that with land pads 680–684 on the first memory module 210. The first memory module 210 includes a plurality of signal lines 430, 440, 450, 460, and 470 that are equal in length and that connect locations on the first electrical connector 310 to land pads 480–484. The first memory module 210 includes an additional plurality of signal lines 630, 640, 650, 660, and 670 that connect additional locations on the first electrical connector 310 to the land pads 680–684. The signal lines 630, 640, 650, 660, and 670 are routed on a third layer (not shown) and a fourth layer (not shown) of the first memory module 210.

The signal line 630 includes a first trace 631 on a third layer (not shown) of the memory module 311 that connects a sixth location 611 on the electrical connector 310 to a sixth via 635 on the third layer of the first memory module 210. The signal line 630 includes a second trace 632 on a fourth layer of the first memory module 210 that connects the sixth via 635 to the land pad 680. The signal line 640 includes a first trace 641 on the third layer of the first memory module 210 that connects a seventh location 612 on the electrical connector 310 to a seventh via 645 on the third layer of the first memory module 210. The signal line 640 includes a second trace 642 on the fourth layer of the first memory module 210 that connects the seventh via 645 to the land pad 681. The signal line 650 includes a first trace 651 on the third layer of the first memory module 210 that connects a eighth location 613 on the electrical connector 310 to a eighth via 655 on the third layer of the first memory module 210. The signal line 650 includes a second trace 652 on the fourth layer of the first memory module 210 that connects the eighth via 655 to the land pad 682. The signal line 660 includes a first trace 661 on the third layer of the first memory module 210 that connects a ninth location 614 on the electrical connector 310 to a ninth via 665 on the third layer of the first memory module 210. The signal line 660 includes a second trace 662 on the fourth layer of the first memory module 210 that connects the ninth via 665 to the land pad 683. The signal line 670 includes a first trace 671 on the third layer of the first memory module 210 that connects a tenth location 615 on the electrical connector 310 to a tenth via 675 on the third layer of the first memory module 210. The signal line 670 includes a second trace 672 on the fourth layer of the first memory module 210 that connects the tenth via 675 to the land pad 684.

As illustrated in FIG. 6, the signal lines 630, 640, 650, 660, and 670 are routed similarly to signal lines 430, 440, 450, 460, and 470 in that they are routed such that they are equal in length. This is achieved by selecting a signal line length and strategically placing the vias 635, 645, 655, 665, and 675 at locations on the first memory module 210 such that signal lines routing through the vias 635, 645, 655, 665, and 675 would equal that signal line length. According to an embodiment of the present invention, some of the vias are placed at a location on the first memory module 210 which would require a section of a second trace on one layer to double back towards a direction previously traveled by a section of a first trace on a second layer. By utilizing a third and fourth layer of the memory module 210, a portion of the signal lines 630, 640, 650, 660, and 670 may be routed above or underneath signal lines 430, 440, 450, 460, and 470 thus conserving surface area on the first memory module 210. Utilizing an additional two layers of the memory module 210 to route 90° signal lines allows twice as many signal lines to be routed in the same amount of space.

Referring back to FIG. 4, according to an embodiment of the first memory module 210, the memory devices 420–427 and 490–497 are serially connected with each other via the memory bus 300. Each memory device is connected to at least one other memory device on the opposite side of the first memory module 210. Memory device 420 is connected to memory device 490. Memory device 490 is connected to memory device 421. Memory device 421 is connected to memory device 491. Memory device 491 is connected to memory device 422. Memory device 422 is connected to memory device 492. Memory device 492 is connected to memory device 423. Memory device 423 is connected to memory device 493. Memory device 493 is connected to memory device 424. Memory device 424 is connected to memory device 494. Memory device 494 is connected to memory device 425. Memory device 425 is connected to memory device 495. Memory device 495 is connected to memory device 426. Memory device 426 is connected to memory device 496. Memory device 496 is connected to memory device 427. Memory device 427 is connected to memory device 497. The signals on electrical contact 310 are transmitted first to memory device 420 via the signal lines 430, 440, 450, 460, and 470 of the memory bus 300. The signals are then transmitted serially from the memory device 420 to the other memory devices 421–427, and 490–497.

According to an embodiment of the present invention, the memory devices 421–427 and 490–497 are identical components having identical packaging and identical pin-outs. The memory devices 420–427 and 490–497 have matched component to component pitch and stub lengths from a via "T" point to the land pad of the component. By matching the signal lines of the memory bus 300 connecting the memory devices 420–427 and 490–49, the electrical delay of signals transmitted between memory devices 420–427 and 490–497 are matched even when signals are transmitted to the memory devices 420–427 and 490–497 at high frequencies.

Figure 7:
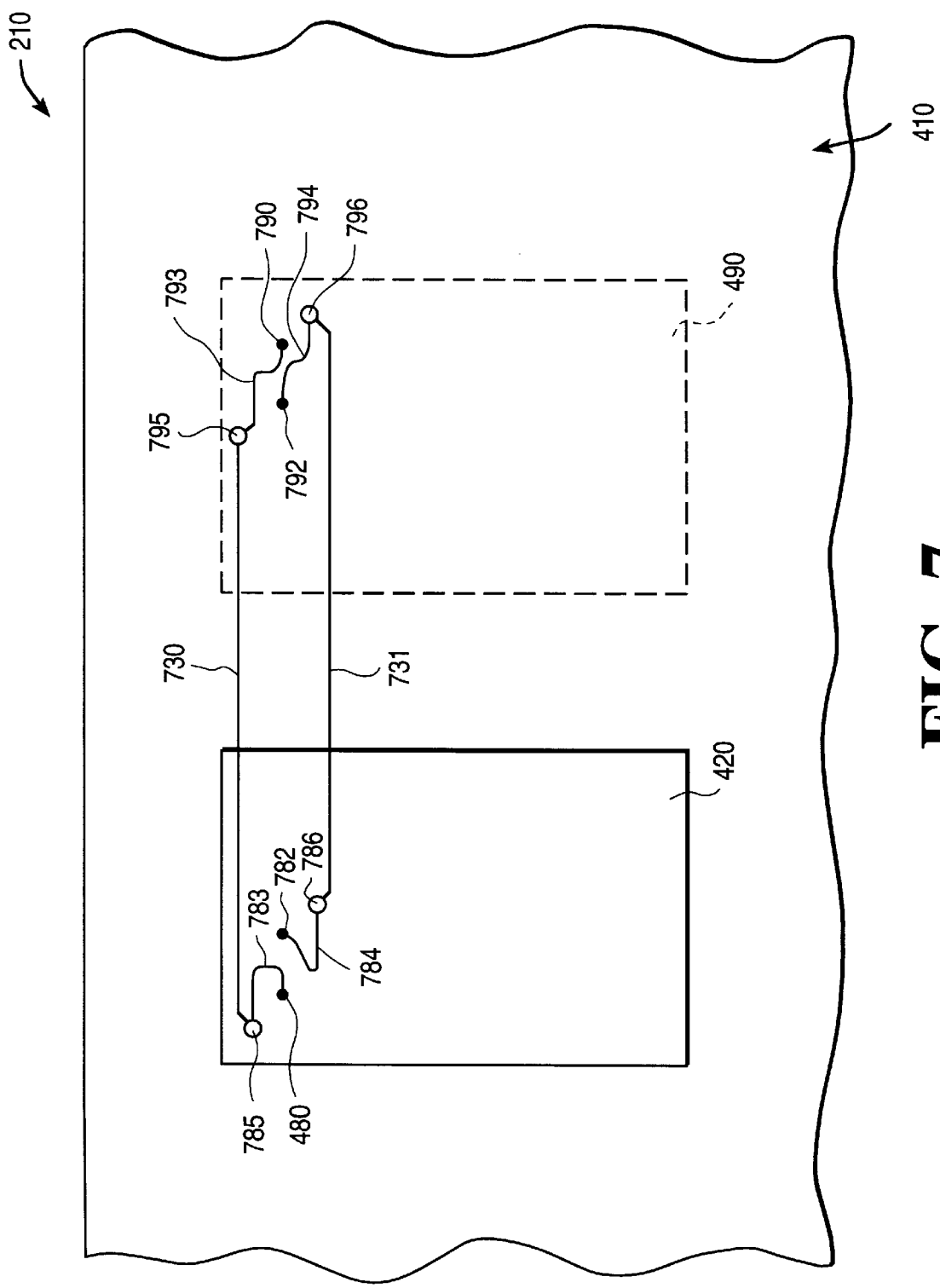
FIG. 7 illustrates an exemplary routing technique used for connecting land pads for memory devices placed back-to-back on a memory module according to an embodiment of the present invention.

FIG. 7 illustrates an exemplary routing technique used for connecting land pads for memory devices 420 and 490 placed back-to-back on the first memory module 210 according to an embodiment of the present invention. The memory device 420 has a first contact (not shown) that interfaces with a first land pad 480 on the first side 410 of the first memory module 210. The memory device 420 has a second contact (not shown) that interfaces with a second land pad 782 on the first side 410 of the first memory module 210. The memory device 490 has a first contact (not shown) that interfaces with a first land pad 790 on the second side (not shown) of the first memory module 210. The memory device 490 has a second contact (not shown) that interfaces with a second land pad 792 on the second side of the first memory module 210.

The land pad 480 on the first side 410 of the first memory module 210 is connected to the land pad 790 on the second side of the first memory module 210. A stub 783 on the first side 410 of the first memory module 210 connects the land pad 480 to a via 785 on the first side 410 of the first memory module 210. The via 785 is connected to a trace 730 on a first internal layer (not shown) of the first memory module 210 which is connected to a via 795. The via 795 is connected to a stub 793 on the second side of the first memory module 210 that is connected to the land pad 790. The land pad 782 on the first side 410 of the first memory module 210 is connected to the land pad 792 on the second side of the first memory module 210. A stub 784 on the first side 410 of the first memory module 210 connects the land pad 782 to a via 786 on the first side 410 of the first memory module 210. The via 786 is connected to a trace 731 on a second internal layer (not shown) of the first memory module 210 which is connected to a via 796. The via 796 is connected to a stub 794 on the second side of the first memory module 210 that is connected to the land pad 792.

Prior art routing techniques typically placed vias closest to the land pads that they are to be connected to. The placement of the vias 785, 786, 795, and 796 are selected such that the pitches of the traces 730 and 731 are matched in length according to an embodiment of the present invention. In order to match the pitches of trace 730 and 731, via 795 is placed next to land pad 792 and via 796 is placed next to land pad 790. This, in effect, "crosses" the vias 795 and 796 since via 795 is connected to land pad 790, not land pad 792, and via 796 is connected to land pad 792 not land pad 790.

Prior art routing techniques typically routed stubs connecting land pads to vias directly, thus utilizing the minimal amount of stub length. By crossing the vias 795 and 796, the stub 793 connecting land pad 790 and via 795 and the stub 794 connecting land pad 792 and via 796 are made longer in length than they would have been had the vias 795 and 796 not been crossed. In order to match the stub lengths of stubs connected to non-crossed vias 785 and 786 to that of crossed vias 795 and 796, additional stub lengths are added to stubs 783 and 784, according to an embodiment of the present invention, by routing a non-direct connection between their respective land pads and vias.

It should be appreciated that the routing technique described for matching the component to component pitch of memory devices 420 and 490 and the stub lengths from the via "T" points to the lad pads of memory devices 420 and 490 may be used for matching component to component pitch and stub lengths for other types of components placed back-to-back on a printed circuit board. It should also be appreciated that in matching the component to component pitch, the vias may be placed at any location on the printed circuit, and that both or neither set of vias could be crossed. The routing technique of the present invention allows components to have matching component to component pitch and stub lengths from via "T" points to land pads of the components without requiring one of the components to be a mirrored package of the other. Matching component to component pitch and stub lengths of components placed back-to-back of each other on a printed circuit board without requiring the manufacturing of mirrored packages of the components reduces the over cost of building the product.

FIG. 7 illustrates the matching of component to component pitch of memory devices 420 and 490 and the stub lengths from via "T" points to the land pads of memory devices 420 and 490 for two contact points on the memory devices 420 and 490 that required connections. It should be appreciated that the routing technique described may be used for matching the pitch and stub lengths for any number of contact points on the memory devices 420 and 490. It should also be appreciated that the described technique may be used to match the pitch and stub lengths for additional memory devices on the first memory module 410.

Referring back to FIG. 3, the third memory module 212 is shown to have two rows of memory devices connected in series via the memory bus 300. The memory bus 300 makes a 180° turn as it connects a memory device 340 from a first row with a memory device 341 from a second row. In order to preserve the timing requirements of the memory devices, the length of a signal lines of the memory bus 300 connecting the electrical devices are equal in length in order to reduce differences in electrical delay and capacitance between the signal lines.

Figure 8:
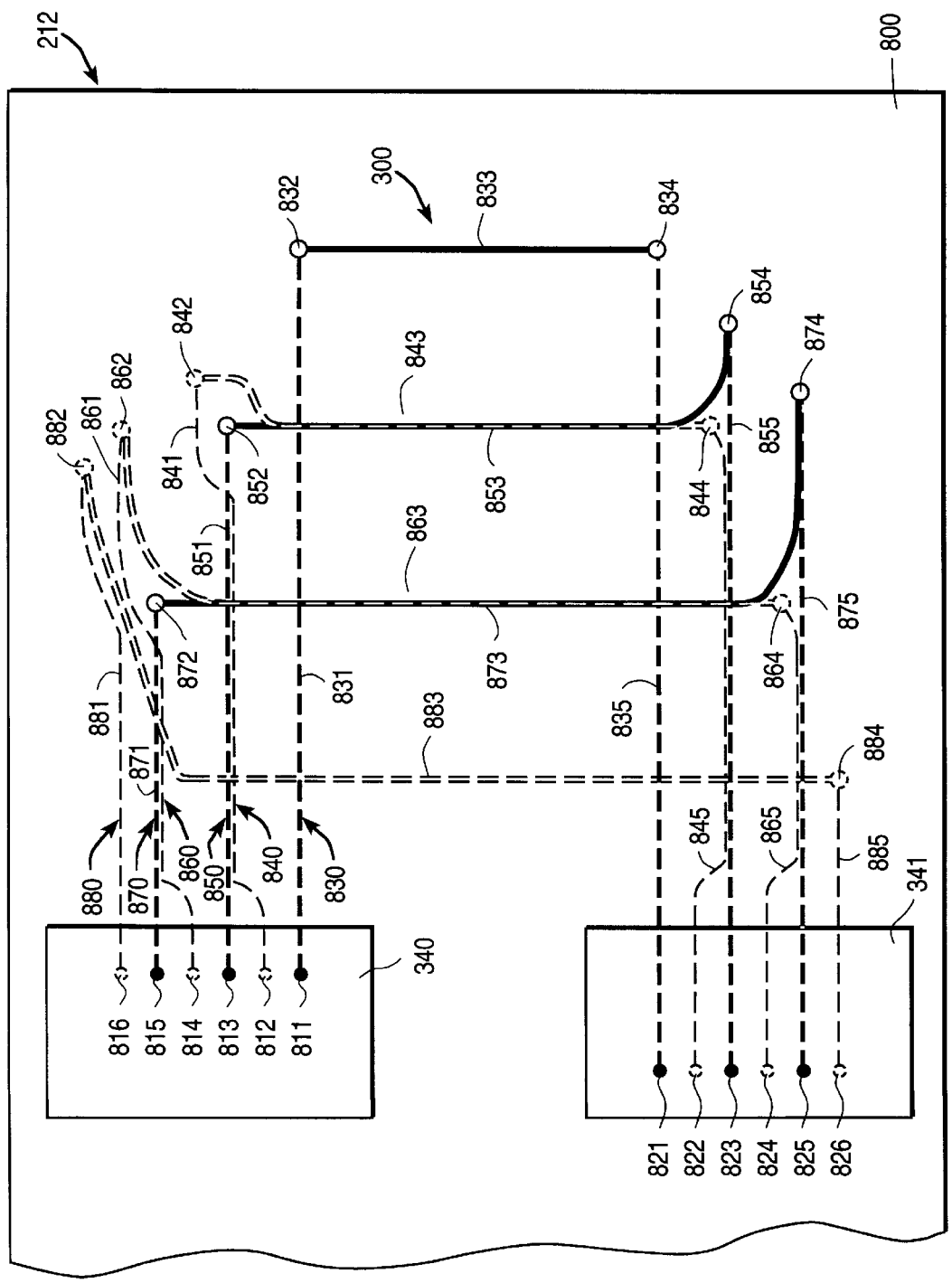
FIG. 8 illustrates an exemplary technique for routing signal lines making an 180° turn on a printed circuit board utilizing four layers of the printed circuit board according to an embodiment of the present invention.

FIG. 8 illustrates an exemplary technique for routing signal lines making 180° turns on a printed circuit board utilizing four layers of the printed circuit board according to an embodiment of the present invention. FIG. 8 illustrates the third memory module 212 having a first memory device 340 and a second memory device 341. The first memory device 340 includes a plurality of contacts (not shown) that interface with land pads 811–816 on the third memory module 212. The second memory device 341 includes a plurality of contacts (not shown) that interface with land pads 821–826 on the third memory module 212. The third memory module 212 includes a memory bus 300 having a plurality of signal lines 830, 840, 850, 860, 870, and 880 that connect the land pads 811–816 interfacing the first memory device 340 with the land pads 821–826 interfacing the second memory device 341. The memory devices 340 and 341 are configured on the third memory module 212 such that the signal lines 830, 840, 850, 860, 870, and 880 must be routed to make a 180° turn in order to connect the land pads 811–716 to the land pads 821–726.

The signal line 830 includes a first trace 831 on a first layer 800 of the third memory module 212 that connects the land pad 811 to a first via 832 on the first layer 800 of the third memory module 212. The signal line 830 includes a second trace 833 on a second layer (not shown) of the third memory module 212 that connects the first via 832 to a second via 834 on the second layer of the third memory module 212. The signal line 830 includes a third trace 835 on the first layer 800 of the memory module 310 that connects the second via 834 to the land pad 821 on the first layer 800 of the third memory module 212.

The signal line 840 includes a first trace 841 on a third layer (not shown) of the third memory module 212 that connects the land pad 812 to a third via 842 on the third layer of the third memory module 212. The signal line 840 includes a second trace 843 on a fourth layer (not shown) of the third memory module 212 that connects the third via 842 to a fourth via 844 on the fourth layer of the third memory module 212. The signal line 840 includes a third trace 845 on the third layer of the third memory module 212 that connects the fourth via 844 to the land pad 822 on the fourth layer of the third memory module 212. By routing the signal line 840 through the third and fourth layers of the third memory module 212, portions of the signal line 840 may be routed above or beneath the signal line 850 as illustrated in FIG. 8. This allows surface area on the third memory module 212 to be conserved while increasing signal line routing density.

The signal line 850 includes a first trace 851 on a first layer 800 of the third memory module 212 that connects the land pad 813 to a fifth via 852 on the first layer 800 of the third memory module 212. The signal line 850 includes a second trace 853 on a second layer (not shown) of the third memory module 212 that connects the fifth via 852 to a sixth via 854 on the second layer of the third memory module 212. The signal line 850 includes a third trace 855 on the first layer 800 of the third memory module 212 that connects the sixth via 854 to the land pad 823 on the first layer 800 of the third memory module 212.

The signal line 860 includes a first trace 861 on a third layer of the third memory module 212 that connects the land pad 814 to a seventh via 862 on the third layer of the third memory module 212. The signal line 860 includes a second trace 863 on the fourth layer of the third memory module 212 that connects the seventh via 862 to a eighth via 864 on the fourth layer of the third memory module 212. The signal line 860 includes a third trace 865 on the third layer of the third memory module 212 that connects the eighth via 864 to the land pad 824 on the fourth layer of the third memory module 212. By routing the signal line 860 through the third and fourth layers of the third memory module 212, portions of the signal line 860 may be routed above or beneath the signal line 870 as illustrated in FIG. 8. This allows surface area on the third memory module 212 to be conserved while increasing signal line routing density.

The signal line 870 includes a first trace 871 on a first layer 800 of the third memory module 212 that connects the land pad 815 to a ninth via 872 on the first layer 800 of the third memory module 212. The signal line 870 includes a second trace 873 on a second layer of the third memory module 212 that connects the ninth via 872 to a tenth via 874 on the second layer of the third memory module 212. The signal line 870 includes a third trace 875 on the first layer 800 of the third memory module 212 that connects the tenth via 874 to the land pad 825 on the first layer 800 of the third memory module 212.

The signal line 880 includes a first trace 881 on a third layer of the third memory module 212 that connects the land pad 816 to an eleventh via 882 on the third layer of the third memory module 212. The signal line 880 includes a second trace 883 on a fourth layer of the third memory module 212 that connects the eleventh via 882 to a twelfth via 884 on the fourth layer of the third memory module 212. The signal line 880 includes a third trace 885 on the third layer of the third memory module 212 that connects the twelfth via 884 to the land pad 826 on the fourth layer of the third memory module 212.

The signal lines 830, 840, 850, 860, 870, and 880 are routed such that they are equal in length. This is achieved by selecting a signal line length and strategically placing the vias 832, 834, 842, 844, 852, 854, 862, 864, 872, 874, 882, and 884 at locations on the third memory module 212 such that signal lines routing through them would equal that signal line length. According to an embodiment of the present invention, some of the vias are placed at a location on the third memory module 212 which would require a section of a second trace on a first layer to double back towards a direction previously traveled by a section of a first trace on a second layer. According to an embodiment of the present invention, some of the vias are placed at a location on the third memory module 212 which would require a section of a forth trace on one layer to double back towards a direction previously traveled by a section of a third trace on a second layer. Thus, when a signal line connecting a first land pad and a second land pad is shorter in length than the selected signal line length, vias corresponding to the signal line may be strategically moved to lengthen the traces on the signal line so that the length of the signal line matches the selected signal line length.

Figure 9:
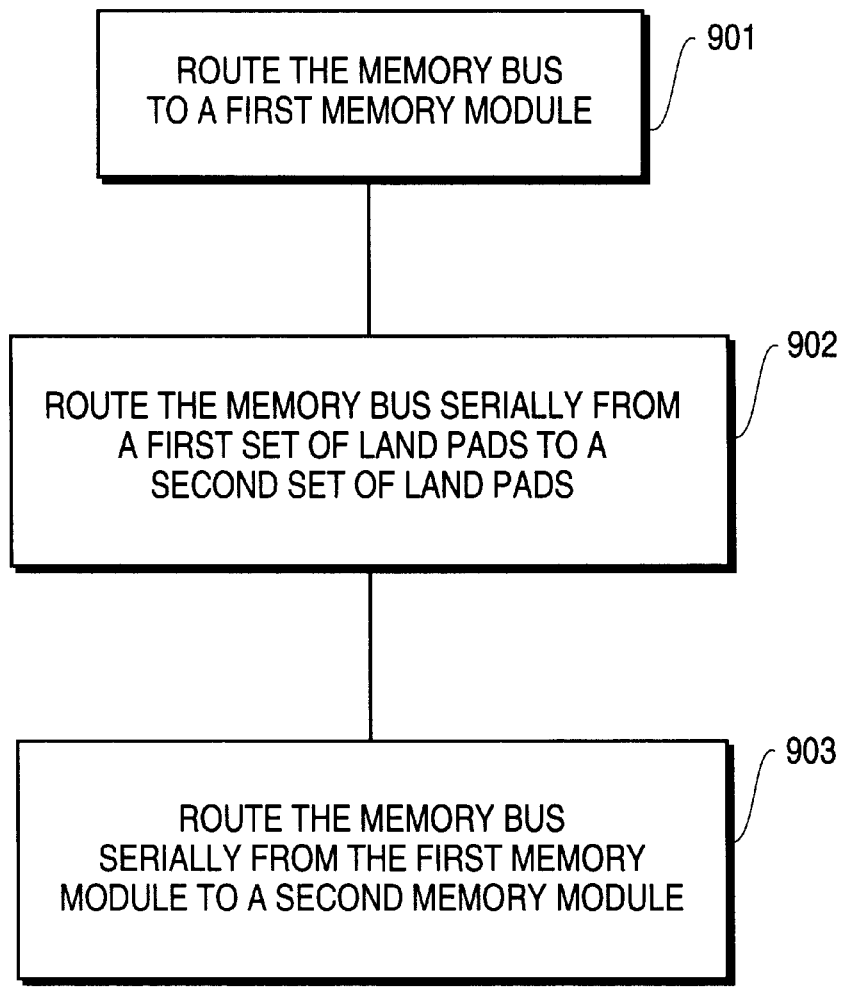
FIG. 9 is a flow chart illustrating a method for implementing a multi-module memory system according to an embodiment of the present invention.

FIG. 9 is a flow chart illustrating a method for implementing a multi-module memory system according to an embodiment of the present invention. At step 901, a memory bus is routed to a first memory module. According to an embodiment of the present invention, routing the memory bus to the first memory module is achieved by routing the memory bus to a first socket connector, routing the memory bus off the socket connector onto a first electrical connector on the first memory module, and routing the memory bus off of the first electrical connector onto a first set of land pads connected to a first memory device. According to an embodiment of the present invention, routing the memory bus off of the first electrical connector onto the first set of land pads is achieved by routing a first signal line 90° from a first location on the electrical connector to a first land pad of the first set of land pads, and routing a second signal line 90° from a second location on the electrical connector to a second land pad of the first set of land pads while matching a length of the second signal line with a length of the first signal line.

At step 902, the memory bus is routed serially from a first set of land pads connected to a first memory device mounted on a first side of the first memory module to a second set of land pads connected to a second memory device mounted on a second side of the memory module. According to an embodiment of the present invention, routing the memory bus from the first set of land pads to the second set of land pads is achieved by matching a first length of a first stub connecting a first land pad from the first set of land pads to a first via on the first side of the first memory module with a first length of a first stub connecting a first land pad from the second set of land pads to a first via on the second side of the first memory module, and matching a second length of a second stub connecting a first land pad from the second set of land pads to a second via on the first side of the first memory module with a second length of a second stub connecting a second land pad from the second set of land pads to a second via on the second side of the memory module. Routing the memory bus from the first set of land pads to the second set of land pads is further achieved by matching a first pitch of a first trace connecting the first via on the first side of the first memory module with the first via on the second side of the first memory module with a second pitch of a second trace connecting the second via on the second side of the first memory module with the second via on the second side of the first memory module.

At step 903, the memory bus is serially routed from the first memory module to a second memory module. According to an embodiment of the present invention, routing the memory bus serially from the first memory module to the second memory module is achieved by routing the memory bus from a last memory device on the first memory module to a second electrical connector on the first memory module, routing the memory bus off from the second electrical connector back onto the first socket connector, routing the memory bus from the first socket connector to a second socket connector, and routing the memory bus off the second socket connector onto a first electrical connector on the second memory module.

In the foregoing description, the invention is described with reference to specific exemplary embodiments thereof. It will, however, be evident that various modifications and changes may be made thereto without departing from the broader spirit and scope of the present invention as set forth in the appended claims. The specification and drawings are to be regarded in an illustrative rather than a restrictive sense.

What is claimed is:

1. A memory system, comprising:

a first memory module having a first electrical connector coupled to a bus, the first electrical connector to receive a set of signals, the set of signals to be serially routed through a first plurality of memory devices of the first memory module to a second electrical connector on the first memory module, wherein the first plurality of memory devices is connected in series between the first electrical connector and the second electrical connector on the first memory module, the second electrical connector coupled to a last memory device of the first plurality of memory devices connected in series of the first memory module; and a second memory module connected in series with the first memory module, wherein the second memory module has a first electrical connector coupled to the second electrical connector of the first memory module to receive the set of signals, the set of signals to be serially routed through a second plurality of memory devices of the second memory module to a second electrical connector on the second memory module, wherein the second plurality of memory devices is connected in series between the first electrical connector and the second electrical connector on the second memory module, the second electrical connector coupled to a last memory device of the second plurality of memory devices connected in series of the second memory module.

2. The memory system of claim 1, further comprising:

a first socket connector that routes memory bus signals to the first electrical connector on the first memory module and that routes the memory bus signals off the second electrical connector on the first memory module; and a second socket connector, coupled to the first socket connector, that routes the memory bus signals to the first electrical connector on the second memory module and that routes the memory bus signals off the second electrical connector on the second memory module.

3. The memory system of claim 1, wherein the first memory module further comprises:

a first 90° signal line that connects a first location on the first electrical connector to a first land pad that is coupled to a first contact of the first memory device; and a second 90° signal line, adjacent and equal in length to the first 90 signal line, that connects a second location on the first electrical connector to a second land pad that is coupled to a second contact of the first memory device.

4. The memory system of claim 1, wherein the first memory device is mounted on a first side of the first memory module and a second memory device is mounted on a second side of the first memory module.

5. The memory system of claim 4, wherein a first signal line that connects a first land pad that is coupled to a first contact of the first memory device with a first land pad that is coupled to a first contact of the second memory device is equal in length to a second signal line that connects a second land pad that is coupled to a second contact of the first memory device with a second land pad that is coupled to the first contact of the second memory device.

6. A computer system, comprising:

a bus;

a processor coupled to the bus;

a memory controller coupled to the bus;

a memory system, coupled to the memory controller having:

a first memory module having a first electrical connector coupled to the bus, the first electrical connector to receive a set of signals, the set of signals to be serially routed through a first plurality of memory devices of the first memory module to a second electrical connector on the first memory module, wherein the first Plurality of memory devices is connected in series between the first electrical connector and the second electrical connector on the first memory module, the second electrical connector coupled to a last memory device of the first plurality of memory devices connected in series of the first memory module; and a second memory module connected in series with the first memory module, wherein the second memory module had a first electrical connector coupled to the second electrical connector of the first memory module to receive the set of signals, the set of signals to be serially routed through a second plurality of memory devices of the second memory module to a second electrical connector on the second memory module, wherein the second plurality of memory devices is connected in series between the first electrical connector and the second electrical connector on the second memory module, the second electrical connector coupled to a last memory device of the second plurality of memory devices connected in series of the second memory module.

7. The memory system of claim 6, wherein the first plurality of memory devices is connected in series between the first electrical connector on the first memory module coupled to a first memory device of the first plurality of memory devices and the second electrical connector on the first memory module coupled to a last memory device of the first plurality of memory devices connected in series.

8. The memory system of claim 6, wherein the second plurality of memory devices is connected in series between the first electrical connector on the second memory module coupled to a first memory device of the second plurality of memory devices and the second electrical connector on the first memory module coupled to a last memory device of the second plurality of memory devices connected in series.

9. The memory system of claim 6, further comprising:

a first socket connector that routes memory bus signals to the first electrical connector on the first memory module and that routes the memory bus signals off the second electrical connector on the first memory module; and a second socket connector, coupled to the first socket connector, that routes the memory bus signals to the first electrical connector on the second memory module and that routes the memory bus signals off the second electrical connector on the second memory module.

10. The computer system of claim 6, wherein the first memory module further comprises:

a first 90° signal line that connects a first location on the first electrical connector to a first land pad that is coupled to a first contact of the first memory device; and a second 90° signal line, adjacent and equal in length to the first 90 signal line, that connects a second location on the first electrical connector to a second land pad that is coupled to a second contact of the first memory device.

11. The computer system of claim 6, wherein the first memory device is mounted on a first side of the first memory module and a second memory device is mounted on a second side of the first memory module.

12. The computer system of claim 11, wherein a first signal line that connects a first land pad that is coupled to a first contact of the first memory device with a first land pad that is coupled to a first contact of the second memory device is equal in length to a second signal line that connects a second land pad that is coupled to a second contact of the first memory device with a second land pad that is coupled to the first contact of the second memory device.

13. A method of routing memory bus signals, the method comprising:

routing the memory bus signals to a first electrical connector of a first memory module;

serially routing the memory bus signals through one or more components of the first memory module;

routing the memory bus signal to a second electrical connector of the first memory module; and serially routing the memory bus signals to a first electrical connector of a second memory module.

14. The method of claim 12, wherein routing the memory bus to the first memory module comprises:

routing the memory bus to a first socket connector;

routing the memory bus off the socket connector onto the first electrical connector on the first memory module; and routing the memory bus off of the first electrical connector onto a first set of land pads connected to a first memory device.

15. The method of claim 14, wherein routing the memory bus off of the first electrical connector onto the first set of land pads comprises:

routing a first signal line 90° from a first location on the electrical connector to a first land pad of the first set of land pads; and routing a second signal line 90° from a second location on the electrical connector to a second land pad of the first set of land pads while matching a length of the second signal line with a length of the first signal line.

16. The method of claim 14, further comprising routing the memory bus from the first set of land pads connected to the first memory device mounted on a first side of the first memory module to a second set of land pads connected to a second memory device mounted on a second side of the memory module.

17. The method of claim 16, wherein routing the memory bus from the first set of land pads to the second set of land pads comprises:

matching a first length of a first stub connecting a first land pad from the first set of land pads to a first via on the first side of the first memory module with a first length of a first stub connecting a first land pad from the second set of land pads to a first via on the second side of the first memory module;

matching a second length of a second stub connecting a first land pad from the second set of land pads to a second via on the first side of the first memory module with a second length of a second stub connecting a second land pad from the second set of land pads to a second via on the second side of the memory module.

18. The method of claim 17, further comprising:

matching a first pitch of a first trace connecting the first via on the first side of the first memory module with the first via on the second side of the first memory module with a second pitch of a second trace connecting the second via on the second side of the first memory module with the second via on the second side of the first memory module.

19. The method of claim 14, wherein routing the memory bus to the second memory module, comprises:

routing the memory bus off the second electrical connector on the first memory module;

routing the memory bus to a second socket connector; and routing the memory bus off the socket connector onto a first electrical connector on the second memory module.

* * * * *